United States Patent [19]
Sun

[11] Patent Number: 4,510,453
[45] Date of Patent: Apr. 9, 1985

[54] FREQUENCY MODULATION OR PULSE MODULATION DEMODULATOR

[75] Inventor: Shan C. Sun, Coral Springs, Fla.

[73] Assignee: Westinghouse Electric Corp., Pittsburgh, Pa.

[21] Appl. No.: 397,944

[22] Filed: Jul. 13, 1982

[51] Int. Cl.³ .................. H03D 3/18; H03K 9/06; H04B 1/16
[52] U.S. Cl. .................. 329/106; 329/107; 329/110; 329/126; 329/128; 375/80; 375/82; 375/94; 455/214
[58] Field of Search .............. 329/106, 107, 123, 126, 329/128, 110; 375/94, 80, 82; 455/214

[56] References Cited

U.S. PATENT DOCUMENTS 3,553,597 1/1971 Bugay .................. 329/110
3,961,277 6/1976 Rossi et al. .................. 329/107

FOREIGN PATENT DOCUMENTS 141551 11/1979 Japan .................. 329/110
48826 3/1982 Japan .................. 329/106
0653741 3/1979 U.S.S.R. .................. 329/106

OTHER PUBLICATIONS

Belleson, J. G., "Wideband Frequency Demodulator", IBM Technical Disclosure Bulletin, vol. 9, No. 10, (Mar. 1967), pp. 1464-1466.

Primary Examiner—Eugene R. LaRoche
Assistant Examiner—W. R. Paxman
Attorney, Agent, or Firm—D. R. Lackey

[57] ABSTRACT

A demodulator for demodulating alternating signals modulated by pulse modulation, or by frequency modulation. The demodulator requires only a single constant current source, a single ramp voltage producing capacitor, and a sample-and-hold function. The intelligence contained in the modulated carrier is transformed into a first pulse train, and a second pulse train is produced in response to the first pulse train. The first pulse train samples and holds the ramp voltage, and the second pulse train immediately resets the ramp voltage circuit following each sample. The held voltage is a replica of the modulating signal, produced without the use of filters for removing the carrier.

8 Claims, 3 Drawing Figures

FREQUENCY MODULATION OR PULSE MODULATION DEMODULATOR

BACKGROUND OF THE INVENTION

1. Field of the Invention

The invention relates in general to demodulators, and more specifically, to demodulators for demodulating an alternating signal modulated by frequency or time.

2. Description of the Prior Art

U.S. Pat. No. 4,275,429, which is assigned to the same assignee as the present application, discloses a new and improved solid state protective relay for protecting high-voltage, three-phase alternating current transmission lines. This relay provides the functions of an electro-mechanical pilot-wire protective relay, without the necessity of having a continuous, metallic conductor connected between the points to be compared. Thus, this relay, may be used with many different types of communication channels, including a dedicated, uninterruptible Bell Telephone system 3002 channel. While the 3002 channel is an open channel, it is not a continuous metallic circuit, as it may include amplifiers and switchboards in the circuit.

The modem used with this protective relay for the communication link between the points of the transmission line to be monitored and protected, must be able to operate within the constraints of the 3002 channel. The attenuation and envelope delay versus frequency, which will be known for each form of communication link which may be used with the relay, is a minimum in the 3002 channel in a narrow band of approximately 300 Hz around a center frequency of about 1.7 KHz. Thus, it would be desirable to be able to use a carrier frequency in this range when a 3002 channel is used.

A carrier frequency of about 1.7 KHz is a relatively low frequency in the art of protective relaying. Much higher carrier frequencies are normally used because it is desirable to be able to provide a trip signal in response to a fault in the protected line section with as little time delay as possible, such as about 1.5 cycles maximum. Thus, the modem, when operating with a carrier of about 1.7 KHz, cannot afford the time delay associated with filters in the demodulator for removing the carrier. For these reasons, the modem used in a preferred embodiment of the protective relay of U.S. Pat. No. 4,275,429 uses pulse period modulation (PPM) which, in addition to its accuracy and reliability, reduces the filtering requirements in the demodulator.

Co-pending application Ser. No. 239,917, filed Mar. 3, 1981, entitled "Pulse Modulator", now U.S. Pat. No. 4,380,746 which is assigned to the same assignee as the present application, discloses a new and improved pulse period modulator which may be used in the modem of the protective relay. This modulator is free of start-up and latch-up problems, and the carrier frequency is easily selectable in steps to suit the communication channel, from 110 KHz downward, including the desirable frequency range of 1.7 KHz±200 Hz for the 3002 channel.

The demodulator may remove the carrier of the PPM signal without the use of large amounts of filtering, such as by using the principles of U.S. Pat. No. 3,614,641, which is assigned to the assignee of the present application. U.S. Pat. No. 3,614,641 teaches the use of two constant current sources, two ramp voltage capacitor circuits, and an auctioneering circuit. While the demodulator of U.S. Pat. No. 3,614,641 provides an excellent demodulation for frequency or time modulated signals, it would be desirable to provide a modulator which has fewer components, a lower manufacturing cost, and one which does not require the matching of circuit components, if these objectives can be achieved without incurring offsetting disadvantages.

SUMMARY OF THE INVENTION

Briefly, the present invention is a new and improved demodulator, which may be used for demodulating an alternating signal modulated by frequency or by time. The invention recognizes that while the relatively low carrier frequency may be a disadvantage with respect to time, it may be used to great advantage to produce a reliable, low cost demodulator having the requisite resolution when used with carrier frequencies of about 110 KHz and below, including the desirable frequency of 1.7 KHz when used with the 3002 channel.

The invention utilizes only a single constant current source, and a single ramp voltage generating circuit, and thus component matching and auctioneering between like functions is eliminated. The intelligence in the alternating modulated signal is transformed into a first pulse train, which includes a pulse in response to each positive and negative going transition, or zero crossing, to double the resolution, compared with the carrier frequency. A second pulse train is produced from the first pulse train, with each pulse of the second pulse train being initiated at the termination of a pulse in the first pulse train.

A sample-and-hold function samples and holds the voltage of the ramp voltage generating circuit in response to each pulse of the first pulse train. The pulses of the second pulse train reset the ramp voltage generating circuit, following each sampling thereof by the pulses of the first pulse train. The output of the sample-and-hold function is a replica of the modulating signal, and it is obtained without any filtering of the carrier frequency. The 56 samples per cycle of the 60 Hz modulating signal, obtained with a carrier frequency of 1.7 KHz, produces a stepped sinusoidal signal requiring minimal waveform smoothing filters to provide a smooth sinusoidal signal which is substantially an exact replica of the sinusoidal modulating signal.

BRIEF DESCRIPTION OF THE DRAWINGS

The invention may be better understood, and further advantages and uses thereof more readily apparent, when considered in view of the following detailed description of exemplary embodiments, taken with the accompanying drawings in which.

DESCRIPTION OF THE PREFERRED EMBODIMENT

Figure 1:
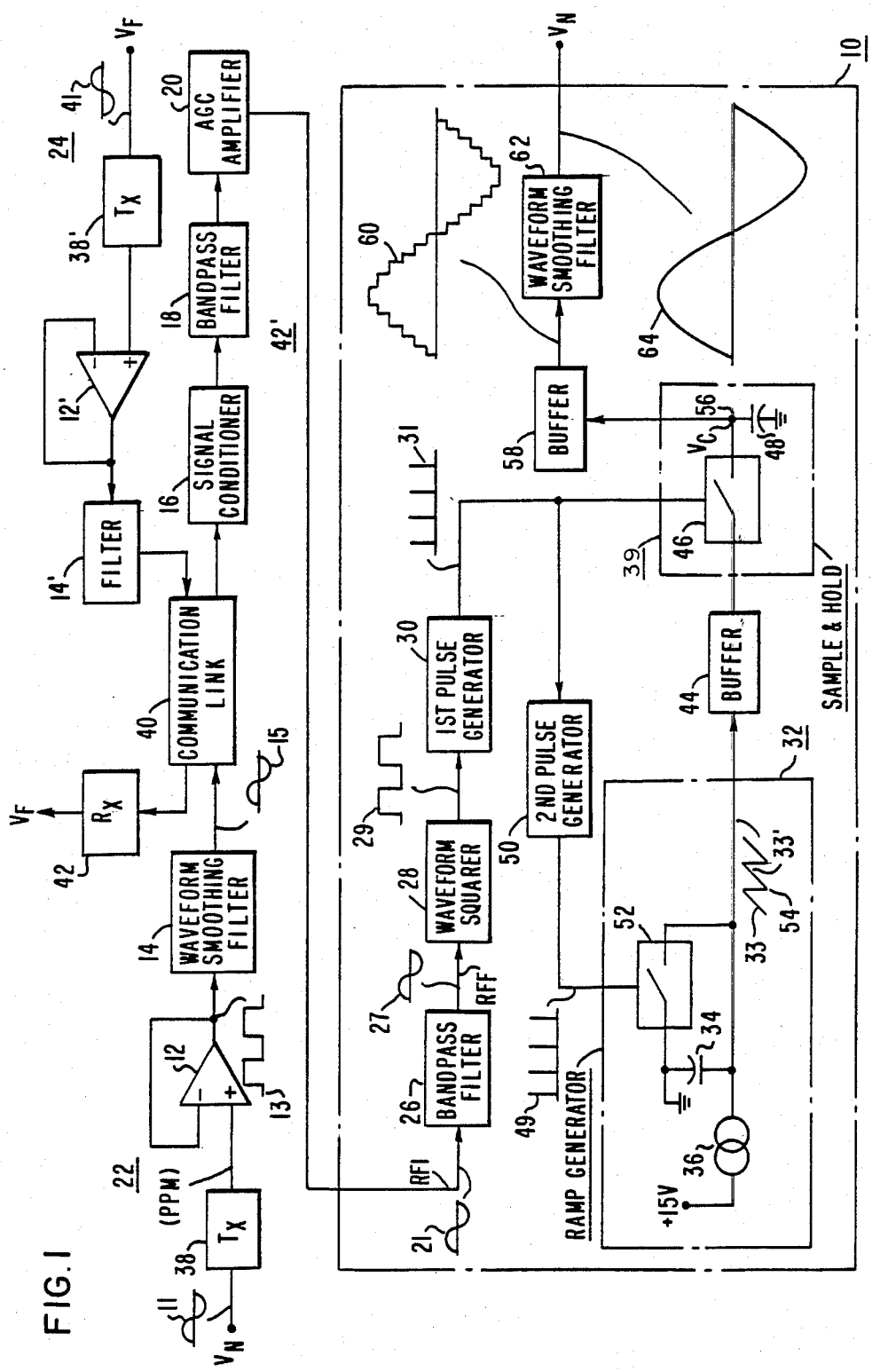
FIG. 1 is a schematic diagram of a demodulator constructed according to the teachings of the invention.

Referring now to the drawings, and to FIG. 1 in particular, there is shown a demodulator 10 constructed according to the teachings of the invention. For purposes of example, demodulator 10 is illustrated in the environment of the protective relay shown in U.S. Pat.

No. 4,275,429. This patent, as well as the hereinbefore-mentioned modulator set forth in U.S. Pat. No. 4,380,746, are hereby incorporated into the specification of the present application by reference. While the demodulator 10 is ideally suited for the protective relay application of U.S. Pat. No. 4,275,429, its use is not intended to be so limited, as it may be used advantageously in many other applications for demodulating alternating signals which have been modulated by time or by frequency. For example, while the demodulator 10 is illustrated for demodulating pulse period modulated signals, the demodulator may also be used to demodulate signals modulated by pulse position and also signals modulated by pulse width. An inversion stage in the demodulator, following the demodulation stage, may change the output from the time domain to the frequency domain, and enable the demodulator to demodulate frequency modulated signals.

More specifically, protective relaying apparatus 22 and 24 is disposed at the near and far terminals, respectively, of a transmission line section to be monitored and protected. Protective relaying apparatus 22, as described in greater detail in the incorporated patent, includes means for obtaining a current derived single-phase composite sequence voltage signal $V_N$ having a sinusoidal waveform 11. This signal is responsive to the three-phase current flowing in the conductors of the protected transmission line, and the $3I_O$ or ground current. This means includes current transformers and a composite sequence filter which mixes predetermined percentages of positive, negative and/or zero sequence currents from the three phases to obtain a single-phase composite sequence voltage whose phase is responsive to the direction of power flow, and whose magnitude is responsive to the current magnitudes in the three phases. The same composite sequence filters now used by the prior art electromechanical pilot-wire relays may be used, with U.S. Pat. No. 2,183,646 describing a composite sequence filter which may be used.

The current derived composite sequence signal or voltage $V_N$ is applied to an evaluation circuit, and also to a transmitter 38. The waveform of the voltage signal $V_N$ is used as the modulating waveform for the type of communication selected for transmitter 38. For example, transmitter 38 may use the modulator of the incorporated patent application to produce pulses at a nominal rate in response to a modulating signal of zero magnitude, and to change the rate as the modulating signal changes. In the telephone communication link application chosen for purposes of example, the PPM pulses at the output of transmitter 38 may be converted to a square wave 13 by an operational amplifier (op amp) 12 connected as a follower, which is filtered in a waveform smoothing filter 14 to produce a sine wave having a frequency of 1.7 KHz±200 Hz for transmission over the telephone circuit, referred to generally as communication link 40 in FIG. 1.

Protective relaying apparatus 22 also includes a receiver 42 connected to the communication link 40, which receives a communication signal responsive to the current derived single-phase composite sequence voltage signal $V_F$, which has a sinusoidal waveform 41, from the protective relaying apparatus 24. Waveform 41 will be substantially 180° out-of-phase with waveform 11 for normal through current in the protected transmission line section, and it will be substantially in-phase with waveform 11 when the protected section is faulted. Receiver 42 demodulates the communication signal to provide signal $V_F$ in a form suitable for comparison with signal $V_N$ in the evaluation circuit.

In like manner, the protective relaying apparatus 24 at the far terminal includes a transmitter 38', an op amp 12', and a waveform smoothing filter 14', for applying the signal $V_F$ to the communication link 40, and a receiver 42' for receiving and demodulating the signal $V_N$ received over the communication link 40. The new and improved demodulator 10 is illustrated as being part of receiver 42'.

More specifically, receiver 42' includes means 16 for conditioning the modulated signal, such as by a circuit which rejects common-mode voltage, and the conditioned signal is then applied to a band-pass filter 18 designed to pass frequencies in the band of interest, such as 1 KHz-2.5 KHz. A band-pass filter for this range will pass the 1.7 KHz±200 Hz carrier signal while cleaning up its waveform, removing spikes and other high and low frequency noise. The signal is amplified in an automatic gain control (AGC) function 20 and the signal is again subjected to a band-pass filter 26, which may be designed to pass the same frequency range as band-pass filter 18. The output of band-pass filter 26, referred to as signal RFF, is a sine wave, as illustrated at 27. This signal is applied to means 28 for converting sine wave 27 to a square wave 29. Thus, the term "waveform squarer", or the term "means squaring the waveform", refers to the waveform shape and not the mathematical function. If details regarding suitable signal conditioner means 16, bandpass filter means 18 and 26, and AGC amplifier 20 are desired, reference may be made to concurrently filed application Ser. No. 397,753, entitled "Signal Quality Monitor for Protective Relay Apparatus System".

The intelligence (period) of square wave 29 is extracted in the form of a first pulse train 31 by first pulse generator means 30, with pulse generator means 30 providing a pulse on each transition of square wave 29. Thus, with a carrier frequency of 1.7 KHz, for example, a first pulse train 31 of pulses are provided at the rate of about 3400 per second (56 pulses over a 60 Hz period).

A ramp voltage generating function 32 provides a linearly increasing ramp voltage 33 with time, across a capacitor 34, by connecting capacitor 34 to be charged from a constant current source 36. Ramp voltage 33 is applied to a sample-and-hold function 39 via a buffer amplifier 44. Sample-and-hold function 39 may include an analog or bilateral switch 46, such as RCA's CD4066, and a capacitor 48. The ramp voltage 33 is applied to the input of switch 46, the output of switch 46 is connected to capacitor 48, and the control input of switch 46 is connected to receive the first pulse train 31 from the first pulse generating means 30.

A second pulse train 49 is provided by second pulse generating means 50, with the pulses of the second pulse train 49 being generated in response to the pulses of the first pulse train. The pulses of the first and second pulse trains do not overlap one another in time, but it is desirable that a pulse of the second pulse train follow each pulse of the first pulse train with as little time delay as possible. In other words, the trailing edge of each pulse in the first pulse train 31 should initiate a pulse in the second pulse train 49, with said trailing edge substantially coinciding with the leading edge of the pulse it is initiating in the second pulse train 41.

The ramp generator function 32 includes a bilateral switch 52 having its input and output terminals connected across capacitor 34, and its control terminal connected to receive the pulses of the second pulse train 49.

Figure 3:
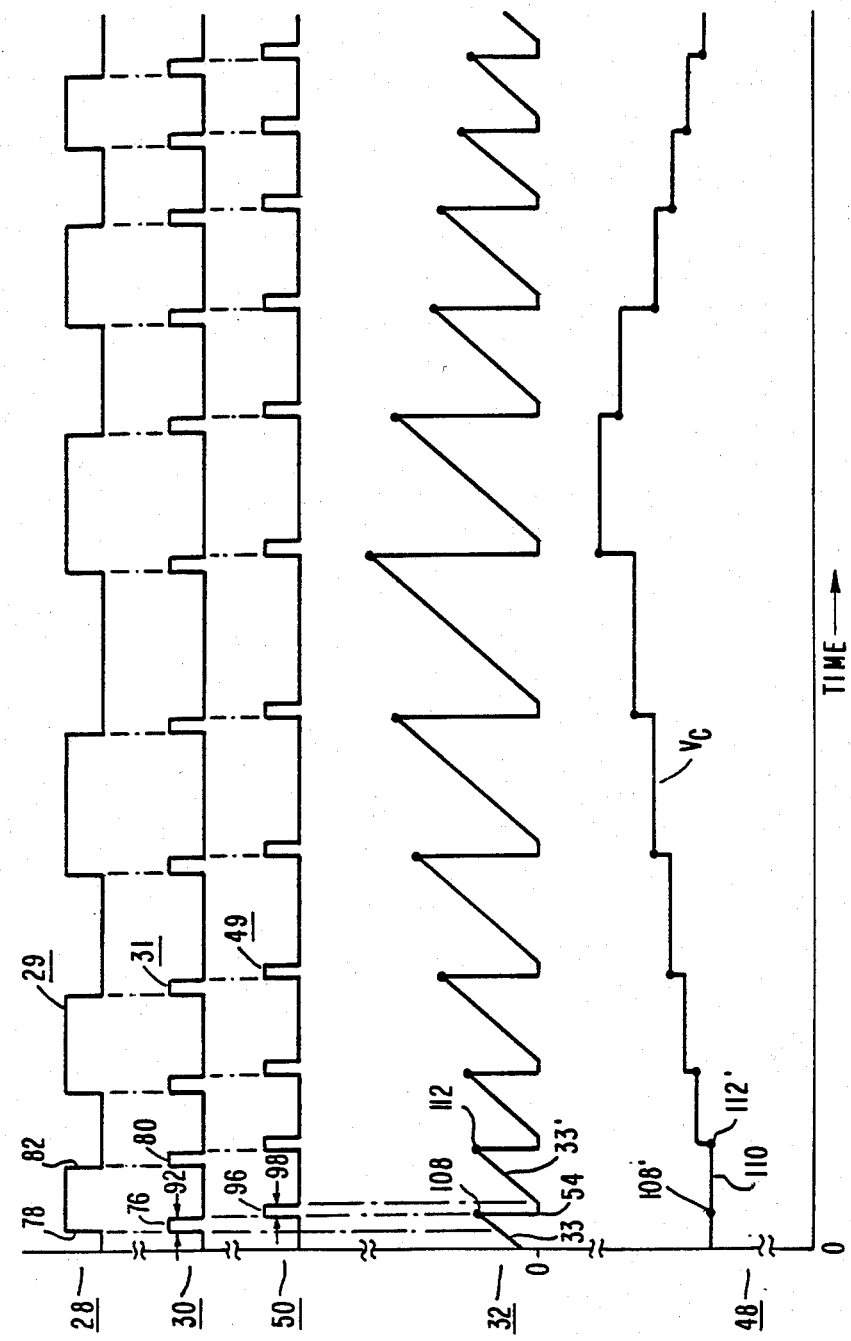
FIG. 3 is a timing diagram illustrating certain waveforms produced in the demodulator shown in FIGS. 1 and 2, which are useful in understanding the invention.

In the operation of demodulator 10, the constant current source 36 charges capacitor 34 along the linear ramp 33. A pulse of the first pulse train 31 closes switch 46 for a short period of time selected to be sufficient to charge capacitor 48 to the level of the ramp voltage 33, and switch 46 will open at the end of this pulse. Capacitor 48 thus holds a charge having a magnitude responsive to the magnitude of the ramp voltage 33 at this sampling point, and as hereinbefore stated, the sampling point is directly responsive to the intelligence contained in the spacing of the pulses of the first pulse train. As soon as the ramp voltage is sampled and held, a pulse from the second pulse train 49 is applied to switch 52, closing it for a period of time sufficient to discharge capacitor 34 and reset the ramp voltage generating function, by returning ramp 33 to ground at point 54 (FIG. 3). Switch 52 opens at the termination of the pulse in the second pulse train, and a new ramp voltage 33' is started.

The voltage appearing between terminal 56 and ground, i.e., the charge on capacitor 48, is applied to a buffer amplifier 58 whose output is a stepped sinusoidal waveform 60. The stepped waveform is applied to a function 62 which includes a gain matching function for matching the gain of the demodulated signal with the local signal it is to be compared with, and it also includes a waveform smoothing function which removes the steps from the stepped sinusoid 60 to provide a smooth sinusoidal signal 64 which is substantially an exact replica of the sinusoidal signal 11 applied to transmitter 38.

When the modulating signal $V_N$ is 60 Hz signal, as in the protective relaying application, and the center frequency of the carrier is 1.7 KHz, as in the telephone channel application hereinbefore described, the stepped waveform will have about 56 steps in each cycle of the sinusoid, which provides excellent resolution, and which requires only minimal filtering in function 62 to smooth the waveform.

The fact that demodulator 10 can be constructed and easily adjusted such that waveform 64 will be substantially an exact replica of waveform 11, can be shown by the following mathematical relationships, wherein:

$V_c(t)$—the voltage across the sample-and-hold capacitor 48
I—the current value provided by constant current source 36
C—the value of capacitor 34 in the ramp generator function 32
$\delta T$—the time duration of a pulse in the second pulse train 49
$T(t)$—the modulated period of the carrier
$T_o$—the unmodulated period of the carrier
$\Delta T$—the time added to, or subtracted from $T_o$ in response to the modulating signal
$K_m$—the modulator gain
$K_d$—the demodulator gain
$V_m(t)$—the modulating signal The charge on the sample-and-hold capacitor is given by the relationship:

$$V_c(t) = (I/C)(T(t) - \delta T) \quad (1)$$

Since I/C is equal to the gain of the demodulator, expression (1) may be written:

$$V_c(t) = K_d(T(t) - \delta T) \quad (2)$$

The period T of the modulated carrier is represented by the expression:

$$T(t) = T_o + \Delta T \quad (3)$$

The modification term $\Delta T$, which is added to, or subtracted from, the unmodulated period, is responsive to the gain $K_m$ of the modulator and the modulating signal $V_m(t)$, and thus may be written:

$$\Delta T = K_m V_m(t) \quad (4)$$

Thus expression (3) may be written:

$$T(t) = T_o + K_m V_m(t) \quad (5)$$

Substituting expression (5) into expression (2) gives the following relationship:

$$V_c(t) = K_d(T_o + K_m V_m(t) - \delta T), \text{ or} \quad (6)$$

$$V_c(t) = K_d T_o + K_d K_m V_m(t) - K_d \delta T \quad (7)$$

$K_d T_o$ and $K_d \delta T$ are DC terms, and may be removed by high pass filters, to provide:

$$V_c(t) = K_d K_m V_m(t) \quad (8)$$

By adjusting the demodulator gain, $K_d$, or the modulator gain $K_m$, such that the product of $K_d$ and $K_m$ is unity, expression (8) is:

$$V_c(t) = V_m(t) \quad (9)$$

Thus, expression (9) illustrates that the voltage $V_c(t)$ across the sample-and-hold capacitor 48 is equal to the modulating signal $V_m(t)$.

Figure 2:
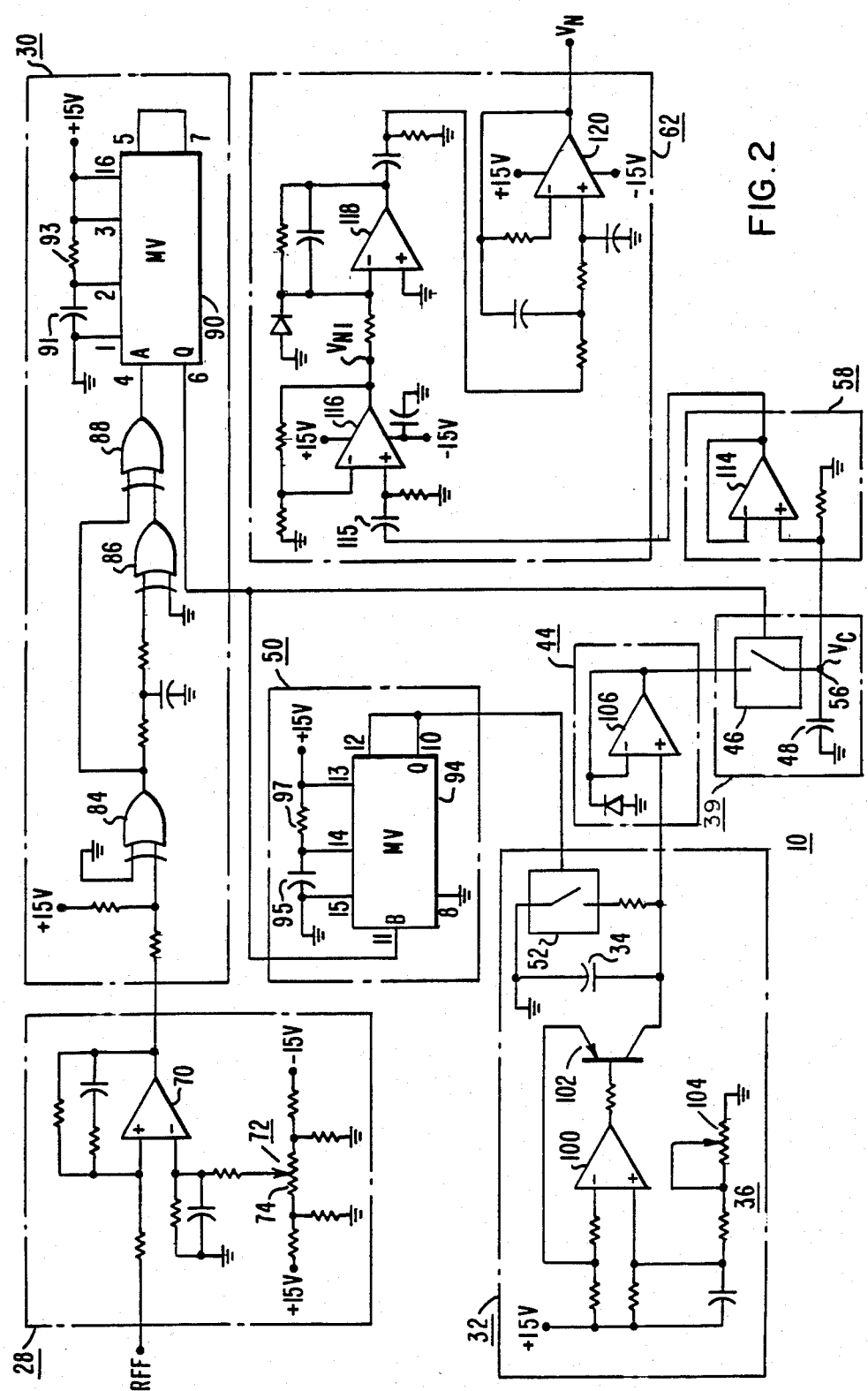
FIG. 2 is a detailed schematic diagram setting forth exemplary embodiments of certain functions shown in block form in FIG. 1.

FIG. 2 is a detailed schematic diagram of an exemplary embodiment of demodulator 10, and FIG. 3 is a timing diagram which sets forth certain waveforms which appear in the demodulator which are useful in understanding the invention. Components and waveforms shown in FIG. 1 which appear again in FIGS. 2 and 3 are identified with the same reference numerals.

More specifically, starting with the band-passed sinusoidal waveform RFF, the waveform squarer function 28 may be provided by an op amp 70 connected as a limiter, with symmetry adjustment means 72. The symmetry adjustment means includes a potentiometer or variable resistor 74. Potentiometer 74 is adjusted such that the waveform which appears at the output of waveform buffer 58 is a straight line when the input signal RFF is the unmodulated carrier.

The square wave 29, shown in FIG. 3, is applied to the first pulse generator means 30. Pulse generator means 30 extracts the pulse period information from the squared waveform by producing pulses at a rate responsive to the pulse period, to provide a first pulse train 31. As shown in FIG. 3, a pulse is provided on each transition of square wave 29, with a pulse 76 being initiated on the positive going transition 78, and a pulse 80 being initiated on the negative going transition 82. Pulse generator means 30 may be constructed of XOR gates 84, 86 and 88, which are connected to provide a pulse on each transition of square wave 29. Another suitable pulse producing circuit which may be used includes a differentiator and a rectifier for inverting the negative going pulses. First and second monostable multivibrators may also be used, connected to trigger on the positive and negative going transitions, respectively. The output of XOR gate 88 is connected to monostable multivibrator 90, such as one of the multivibrators in Motorola's dual package MC14538B, to provide a pulse of the desired duration on the positive going edge of each output pulse from gate 88, and thus on each transition of square wave 29. Thus, as shown in FIG. 3, a pulse 76 is generated on transition 78, having a duration or time interval indicated by reference 92. Interval 92 is selected by capacitor 91 and resistor 93 to just be long enough to allow capacitor 48 to charge, or discharge, to the level of the sampled ramp, such as 7.5 µs.

The second pulse train 49 provided by the second pulse generating means 50 may be provided by a monostable multivibrator 94, which may be the remaining multivibrator of the dual package MC14538B. The first pulse train 31 is connected to the B input of multivibrator 94, to provide an output pulse 96 on each of the negative going transitions of the pulses in the first pulse train 31, such as on the negative going transition of pulse 76 shown in FIG. 3. Multivibrator 94 is connected to a capacitor 95 and a resistor 97 whose values are selected to provide a predetermined pulse duration or interval 98. Interval 98 is selected to just be long enough to discharge capacitor 34 and reset the ramp generating function 32 following each sample-and-hold operation, such as about 100 µs.

The constant current source 36 in the ramp generating function 32 may be provided by op amp 100 and a PNP transistor 102. A potentiometer 104 selects the gain of the demodulator 10. As hereinbefore stated, the product of the modulator gain $K_m$ and the demodulator gain $K_d$ is adjusted to be unity, and potentiometer 104 may be adjusted to provide this result.

The ramp voltage 33, shown in FIG. 3, is applied to switch 46 of the sample-and-hold function 39 via buffer 44. Buffer 44 may be an op amp 106 connected as a voltage follower.

Ramp voltage 33 increases linearly, with a pulse, such as pulse 76 of the first pulse train 31, sampling the voltage on capacitor 48 during interval 92, and then holding the sampled voltage at the end of this interval, as indicated by point 108. A pulse of the second pulse train 49, such as pulse 96, then turns switch 52 on to discharge capacitor 34 and reset ramp generating function 32, during the interval 98. The voltage $V_c$ across capacitor 48 is held constant, indicated at 110, until the next sampling point 112. The sampling points on waveform $V_c$ which correspond to those on ramp 33 are given the same reference numerals as the sampling points on the ramps, with the addition of a prime (') mark.

The stepped voltage $V_c$ is applied to a circuit 62 via buffer 58. Circuit 62 includes a signal gain matching function, and a waveform smoothing function. Buffer 58 may include an op amp 114 connected as a voltage follower. Circuit 62 includes a capacitor 115 which removes the DC terms set forth in expression (7). An op amp 116 is connected as a non-inverting amplifier in order to cause the demodulated signal to match the gain of the local signal which it is to be compared with. The amplified signal, with the DC terms removed, is then applied to a low-pass filtering function comprising op amps 118 and 120, connected as active low-pass filters, in order to smooth the waveform and produce a smooth sinusoid $V_N$.

Demodulator 10, as described, is completely time domain. The design uses no frequency related terms, and thus it is easier to understand and simpler to implement. While completely time domain, demodulator 10 may be used to demodulate frequency modulated signals. If the frequency variation $\Delta f$ from the center frequency $f_o$ is small compared with the center frequency, the non-linearity which is introduced is slight, and the demodulator can be used without modification to demodulate frequency modulated signals with good accuracy. If $\Delta f$ is not small compared with $f_o$, an analog divider may be added before the functions provided by circuit 62 to perform the function $f = 1/T$, to change from the time domain to the frequency domain.

In summary, there has been disclosed a new and improved demodulator for demodulating alternating signals which have been modulated by time, or by frequency. The new and improved demodulator makes it practical to use relatively low carrier frequencies in protective relaying apparatus, as it requires no filters for removing the carrier. The minimal filtering required presents only about one-fifth the time delay which would be experienced if normal carrier filtering were to be used. Further, the new and improved demodulator requires only one constant current source and only one capacitor, eliminating the need to match current sources, and also eliminating the need for auctioneering circuits. All of the variables of the demodulator, i.e., the current I provided by the constant current source, the capacitance C of the capacitor in the ramp generator function, and the duration $\delta T$ of the discharge time, are identifiable and precisely controllable, to facilitate the manufacture, test and adjustment of the demodulator. If desired, an inversion stage may be used to transfer from the time to the frequency domain, after the sample-and-hold stage of the demodulator, to demodulate frequency modulated signals.

I claim as my invention:

1. A demodulator for demodulating an alternating signal modulated by frequency modulation, or by pulse modulation, comprising:
   means having a gain of $K_m$ providing an alternating modulated signal,
   means generating a first pulse train in response to said modulated signal,
   means generating a second pulse train in response to said first pulse train,
   means having a gain of $K_d$ generating a ramp signal having a magnitude proportional to time,
   sample-and-hold means for sampling and holding said ramp signal in response to pulses in said first pulse train,
   and means resetting said ramp signal generating means in response to said second pulse train, following each sampling of said ramp signal by said sample-and-hold means,
   wherein the gains $K_m$ and $K_d$ are selected such that their product is unity, resulting in the voltage held by said sample-and-hold means being the demodulated signal.

2. The demodulator of claim 1 wherein the means generating the first pulse train includes means for squaring the waveform of the modulated signal, and means generating the pulses in response to the squared waveform.

3. The demodulator of claim 1 wherein the means generating the first pulse train includes means for squaring the waveform of the modulated signal, and means generating a pulse on each transition of the squared waveform.

4. The demodulator of claim 1 wherein the sample-and-hold means provides as an output an alternating signal having a DC component, and includes high-pass filter means for removing said DC component.

5. The demodulator of claim 1 wherein the sample-and-hold means provides as an output a stepped sinusoidal waveform, and includes low-pass filter means for smoothing the waveform of said stepped sinusoidal waveform.

6. The demodulator of claim 1 wherein the sample-and-hold means provides as an output a sinusoidal signal having a DC component and a stepped waveform, and includes filter means for removing the DC component and for smoothing the waveform.

7. The demodulator of claim 1 wherein the means generating the second pulse train provides pulses which are initiated by the trailing edge of the pulses in the first pulse train.

8. The demodulator of claim 1 wherein the pulses of the first pulse train are produced at a rate twice the frequency of the alternating modulated signal, to double the resolution of the demodulated signal.

* * * * *